(12) United States Patent
Matsuda et al.

(10) Patent No.: US 6,870,230 B2
(45) Date of Patent: Mar. 22, 2005

(54) SEMICONDUCTOR DEVICE UTILIZING DUMMY FEATURES TO FORM UNIFORM SIDEWALL STRUCTURES

(75) Inventors: Takayuki Matsuda, Kyoto (JP); Mizuki Segawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/300,798

(22) Filed: Nov. 21, 2002

(65) Prior Publication Data

US 2003/0098473 A1 May 29, 2003

(30) Foreign Application Priority Data

Nov. 27, 2001 (JP) ........................................ 2001-361244

(51) Int. Cl.[7] .............................................. H01L 23/52
(52) U.S. Cl. ...................................... 257/365; 257/774
(58) Field of Search ................................ 257/202, 365, 257/508, 513, 623, 774, 775; 438/639, 926

(56) References Cited

U.S. PATENT DOCUMENTS

| | | | | |
|---|---|---|---|---|
| 5,883,436 A | * | 3/1999 | Sadjadi et al. ............... | 257/760 |
| 5,923,969 A | * | 7/1999 | Oyamatsu .................... | 438/183 |
| 6,096,641 A | * | 8/2000 | Kunikiyo ..................... | 438/653 |
| 6,204,137 B1 | * | 3/2001 | Teo et al. .................... | 438/305 |
| 6,306,755 B1 | * | 10/2001 | Zheng ......................... | 438/631 |
| 6,384,450 B1 | * | 5/2002 | Hidaka et al. ............... | 257/321 |
| 2001/0055842 A1 | * | 12/2001 | Uh et al. ..................... | 438/183 |
| 2002/0076867 A1 | * | 6/2002 | Lee et al. .................... | 438/183 |

FOREIGN PATENT DOCUMENTS

JP      11330427 A   *  11/1999   .........  H01L/27/115

* cited by examiner

*Primary Examiner*—Stephen W. Smoot
(74) *Attorney, Agent, or Firm*—McDermott Will & Emery LLP

(57) ABSTRACT

An inventive semiconductor device includes: a substrate; a plurality of first projections each including at least a gate electrode and formed on the substrate; and a plurality of second projections formed on the substrate. When a contour surface constituted by the uppermost face of the substrate and by side and upper faces of the first and second projections is measured for every partial area per unit area of the substrate, the maximum partial area of the contour surface is 1.6 or less times larger than the minimum partial area of the contour surface.

12 Claims, 11 Drawing Sheets

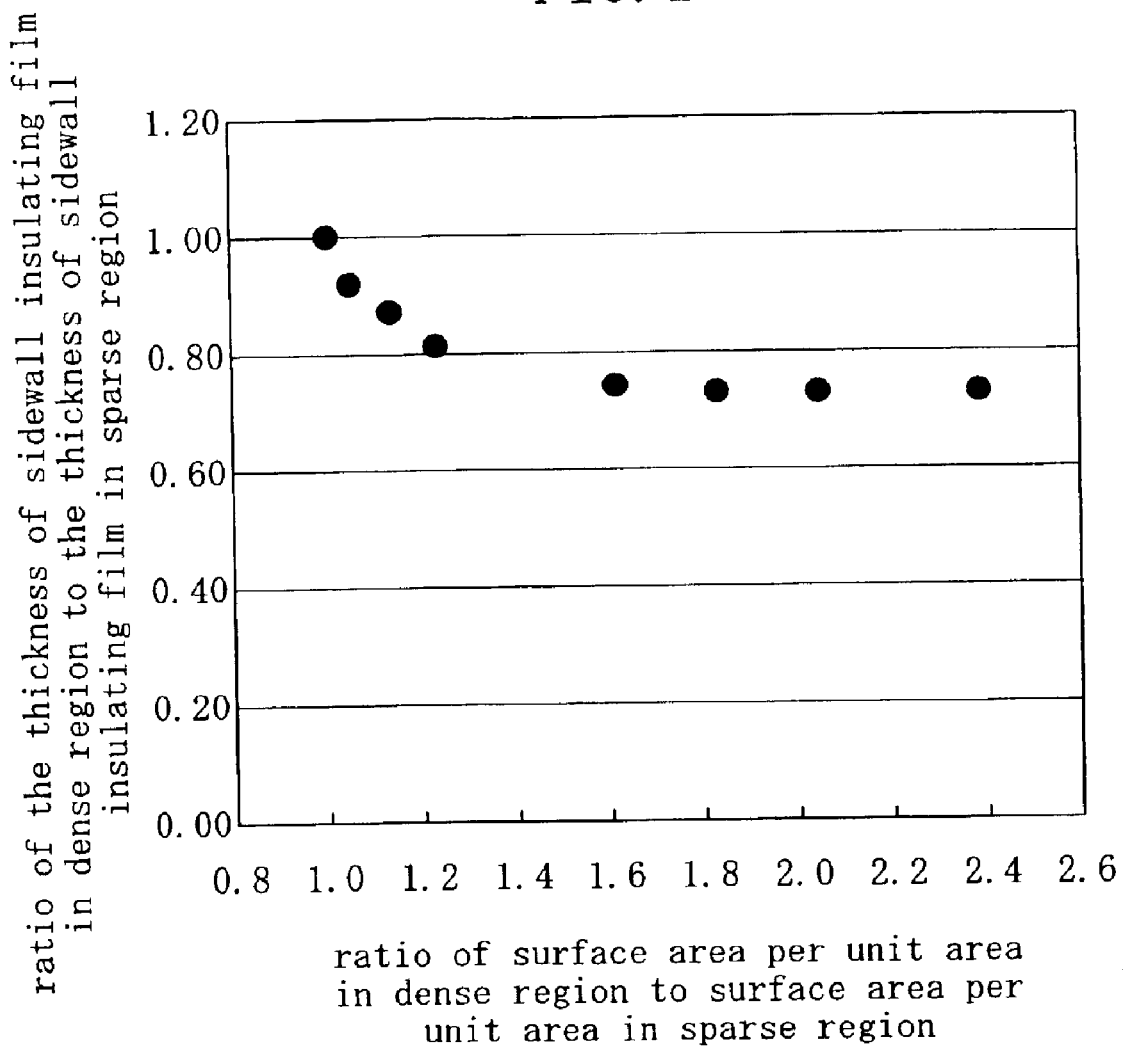

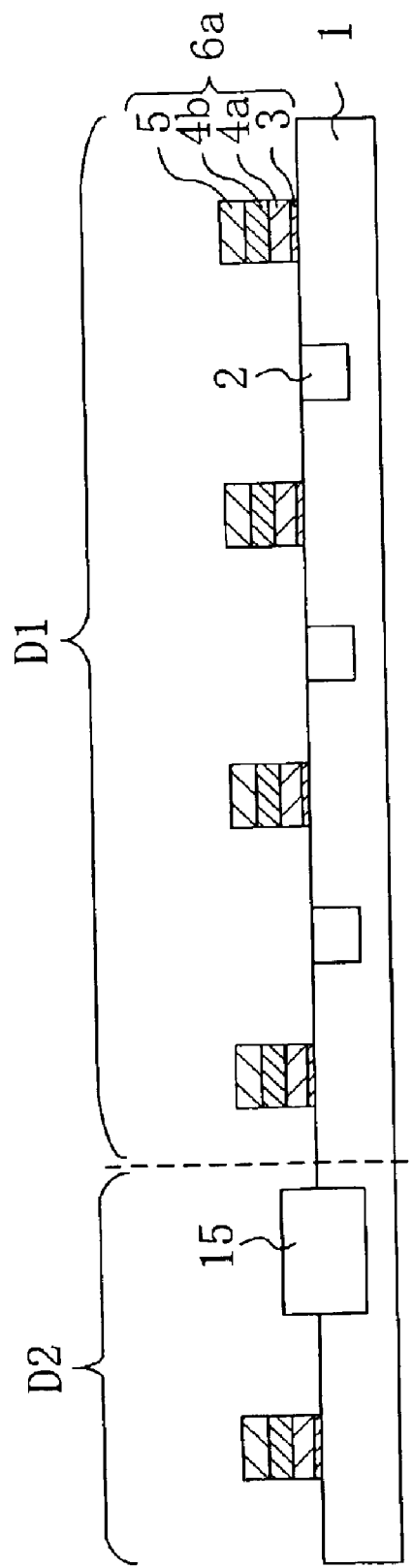
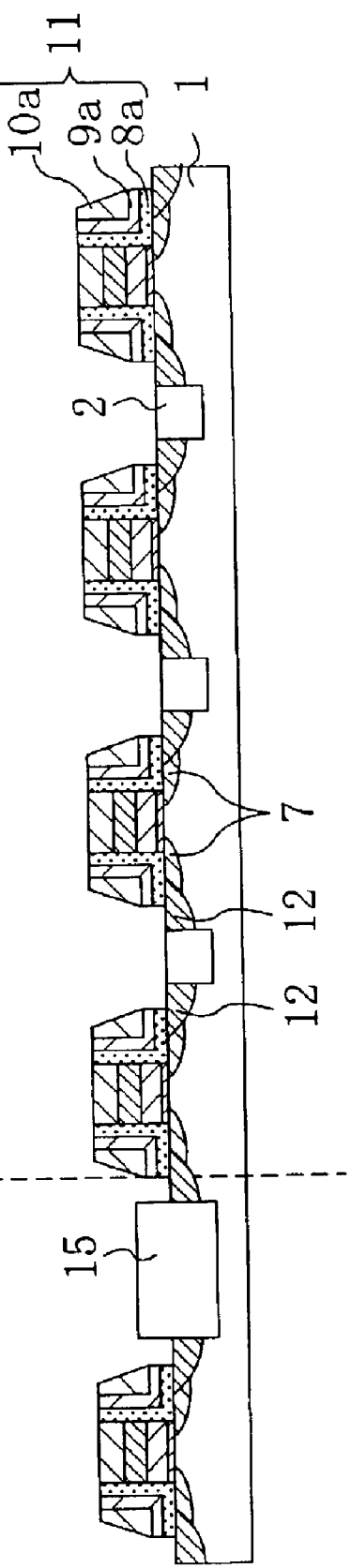

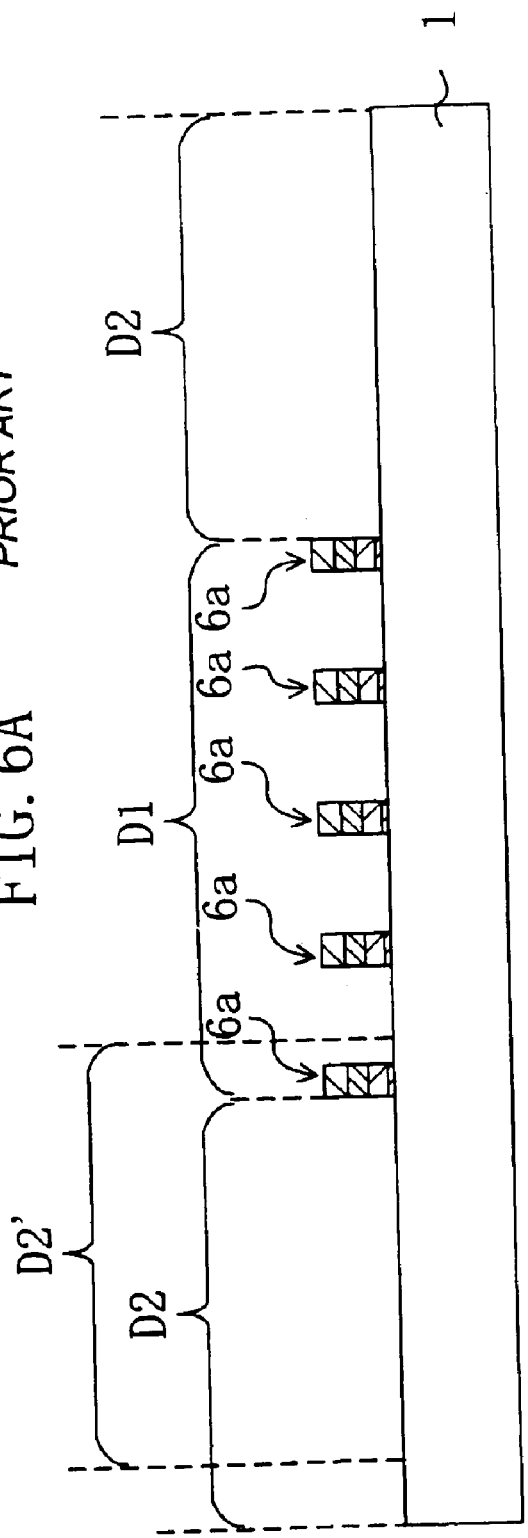
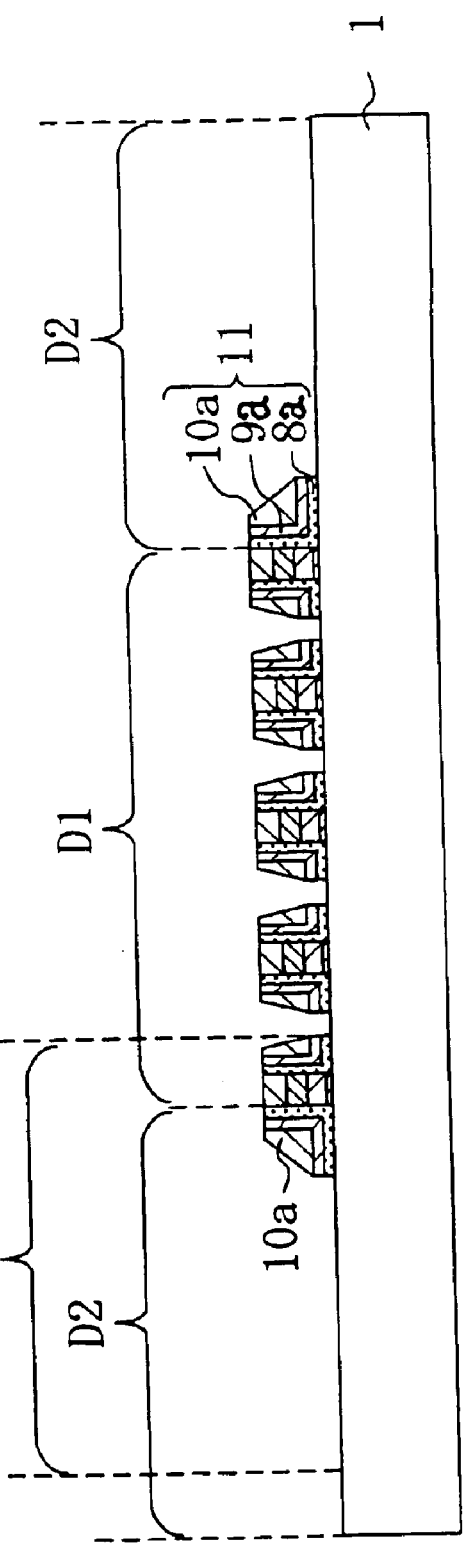

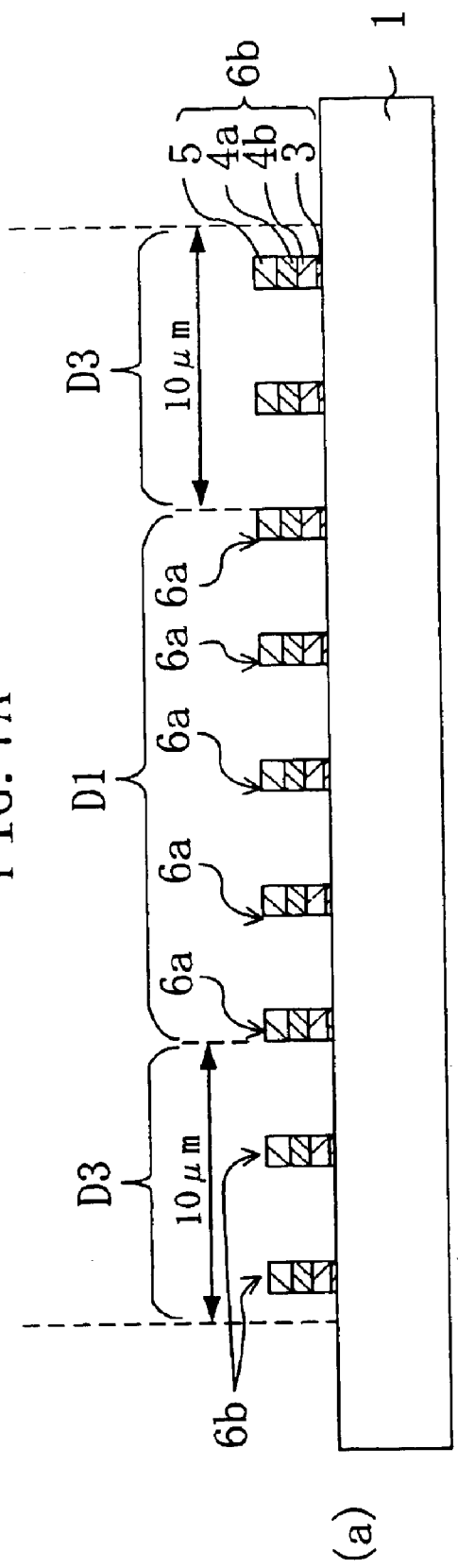
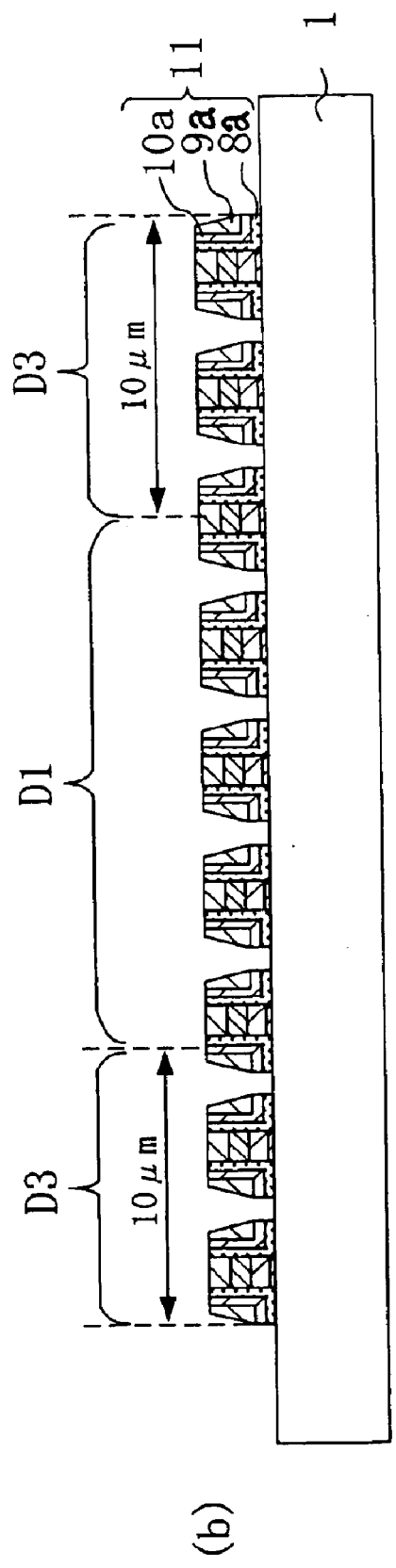

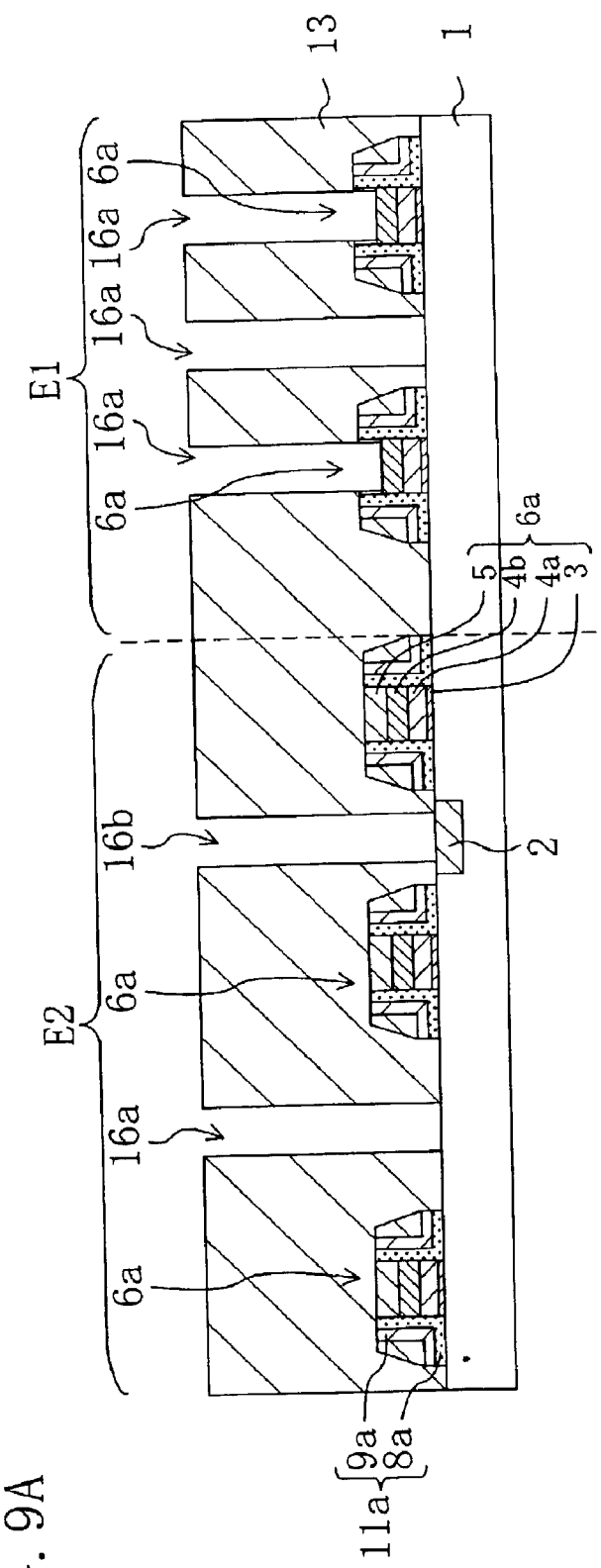
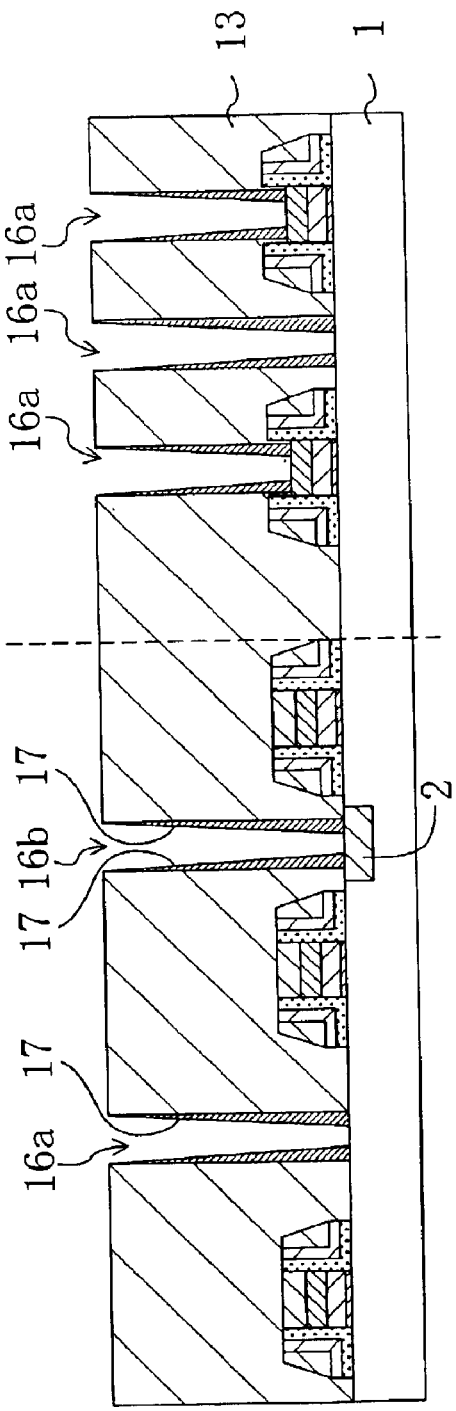
FIG. 9A
FIG. 9B

SEMICONDUCTOR DEVICE UTILIZING DUMMY FEATURES TO FORM UNIFORM SIDEWALL STRUCTURES

BACKGROUND OF THE INVENTION

The present invention relates to semiconductor devices and methods for fabricating the same, and more particularly relates to improving reliability of the semiconductor devices.

Recently, as semiconductor devices have been downsized, spacing between gate electrodes has been reduced. However, it is extremely difficult to reduce the thickness of the gate electrodes because this reduction increases the resistance and also prolongs the delay time. Accordingly, the reduction in thickness of the gate electrodes has not advanced. As a result, the aspect ratio of the gate electrodes (which is herein the ratio of the height of the gate electrodes to the spacing between the gate electrodes) increases so that it is difficult to bury an interlevel dielectric film in the gap between the gate electrodes by a known method.

If a void is present in part of the interlevel dielectric film through which a contact hole is to be formed and which is located between the gate electrodes, there arises a problem that deposition components created by dry etching are attached to the bottom of the contact hole to cause a contact failure.

As a method for solving this problem, a sacrificial sidewall process was proposed (in the 61st Japan Society of Applied Physics, Annual Meeting No.2, p. 781 [5p-ZE-3]). In this process, a sidewall is removed after source and drain are defined so that the spacing between gate electrodes becomes wider and then an interlevel dielectric film is buried in a gap between the gate electrodes.

The sacrificial sidewall process will be hereinafter described with reference to FIGS. 10A through 11B.

First, in a process step shown in FIG. 10A, isolation regions 2 each made of a trench isolation are formed in a semiconductor substrate 1, and then gate electrodes 6 are formed on the substrate. Each of the gate electrodes 6 includes: a gate insulating film 3 of a silicon oxynitride film; a lower gate electrode 4a of polysilicon; an upper gate electrode 4b of a multilayer metal film; and a gate protective layer 5 of a silicon nitride film, in that order from below. Thereafter, impurity ions are implanted into the semiconductor substrate 1 using the gate electrodes 6 as a mask, thereby defining first doped regions 7 to be LDD regions or extension doped regions.

Next, in a process step shown in FIG. 10B, an underlying insulating film 8 of an NSG film (a silicon oxide film containing no impurities), a protective insulating film 9 of a silicon nitride film, and a sidewall insulating film 10 of a BPSG film are formed in this order over the substrate. In this case, the sidewall insulating film 10 is formed by an atmospheric or a subatmospheric CVD process so as to have a sufficient etch selectivity with respect to the underlying insulating film 8 and the protective insulating film 9 during a subsequent wet etching process.

Then, in a process step shown in FIG. 11A, the sidewall insulating film 10, the protective insulating film 9 and the underlying insulating film 8 are etched in this order by anisotropic dry etching, thereby forming sidewalls 11 each having a multilayer structure including an underlying insulating film 8a, a protective insulating film 9a and a sidewall insulating film 10a. Subsequently, impurity ions are implanted into the semiconductor substrate 1 using the gate electrodes 6, the sidewalls 11 and the isolation regions 2 as a mask, thereby defining second doped regions 12 to be heavily-doped source/drain regions.

Thereafter, in a process step shown in FIG. 11B, the sidewall insulating film 10a made of a BPSG film and included in the sidewalls 11 is selectively removed by wet etching, thereby forming L-shaped sidewalls 11a including the underlying insulating film 8a and the protective insulating film 9a so that the spacing between the L-shaped sidewalls 11a formed on side faces of the gate electrodes 6 is sufficiently wide. Subsequently, an interlevel dielectric film 13 of a BPSG film is deposited by a CVD process over the substrate so as to fill in the gap between the L-shaped sidewalls 11a. Then, the surface of the interlevel dielectric film 13 is planarized by a CMP process.

SUMMARY OF THE INVENTION

In the known method described above, in a situation where a dense region D1 in which the gate electrodes 6 are densely formed and a sparse region D2 in which the gate electrodes 6 are sparsely formed are present on the semiconductor substrate 1 as shown in FIG. 10A, if the sidewall insulating film 10 such as a BPSG film to be sidewalls is deposited by, for example, an atmospheric or a subatmospheric CVD process in the process step shown in FIG. 10B, the sidewall insulating film 10 is made thick in the sparse region D2 sparsely including the gate electrodes 6, while the sidewall insulating film 10 is made thin in the dense region D1 densely including the gate electrodes 6. This is because the deposition rate is determined by the feeding rate during an atmospheric or a subatmospheric CVD process so that the thickness of the deposited sidewall insulating film 10 varies depending on the area of the region on which the film is deposited.

Accordingly, in the process step shown in FIG. 11A, when the sidewalls 11 are formed by anisotropic dry etching, the width d1 of the sidewalls 11 located in the dense region D1 densely including the gate electrodes 6 and the width d2 of the sidewalls 11 located in the sparse region D2 sparsely including the gate electrodes 6 have a relationship where d1<d2. That is to say, the variation in the thickness of the deposited sidewall insulating film 10 directly leads to the variation in the width of the sidewalls 11.

If the width d2 of the sidewalls 11 located in the sparse region D2 sparsely including the gate electrodes 6 increases, residues R2 of the underlying insulating film 8 and of the protective insulating film 9 become larger than residues R1 in the dense region D1. Accordingly, when contact holes reaching the second doped regions 12 are formed and then filled with plugs, contact failures between the plugs and the second doped regions 12 are likely to occur. That is to say, the reliability of the resultant semiconductor device might be degraded.

In addition, since the thickness of the sidewall insulating film 10 varies depending on the area of the region on which the film is deposited, the width of the sidewalls 11 might also vary depending on the types of semiconductor devices. Therefore, even if the semiconductor devices have the same design rule, their transistor performances might differ.

It is therefore an object of the present invention to provide a highly reliable semiconductor device.

Specifically, an inventive semiconductor device includes: a substrate; a plurality of first projections each including at least a gate electrode and formed on the substrate; and a plurality of second projections formed on the substrate. In this device, when a contour surface constituted by the uppermost face of the substrate and by side and upper faces of the first and second projections is measured for every partial area per unit area of the substrate, the maximum partial area of the contour surface is 1.6 or less times larger than the minimum partial area of the contour surface.

In a sacrificial sidewall process, the thickness of sidewalls formed on side faces of first projections varies depending on partial areas of a contour surface per unit area of a substrate. On the other hand, according to the present invention, when the contour surface is measured for every partial area per unit area of the substrate, the maximum partial area of the contour surface is 1.6 or less times larger than the minimum partial area of the contour surface. That is to say, the area of the contour surface per unit area of the substrate is substantially uniform. Accordingly, the sidewalls formed on side faces of the first projections have substantially the same thickness between a region where the first projections are densely arranged and a region where the first projections are sparsely arranged. As a result, a semiconductor device is obtained with variation in the width of the sidewalls suppressed.

Each of the first projections may include a gate including a gate insulating film and a gate electrode formed on the gate insulating film, and a sidewall formed on a side face of the gate, while each of the second projections may be a dummy gate including a gate including a gate insulating film and a gate electrode formed on the gate insulating film, and a sidewall formed on a side face of the gate.

Alternatively, each of the first projections may include a gate including a gate insulating film and a gate electrode formed on the gate insulating film, and a sidewall formed on a side face of the gate, while each of the second projections may be an isolation portion.

Another inventive semiconductor device includes: a substrate; a plurality of first projections each including at least a gate electrode and formed on the substrate; and a plurality of second projections formed on the substrate. Each of the first projections and an adjacent one of the first or second projections are spaced 10 µm or less apart from one another.

In this device, the sidewalls formed on side faces of the first projections have substantially the same thickness. As a result, a semiconductor device is obtained with variation in the width of the sidewalls suppressed.

Another inventive semiconductor device includes: a substrate; a plurality of MIS transistors, each of the MIS transistor being formed on the substrate and including a gate insulating film, a gate electrode and a doped region; a plurality of isolation regions formed in the substrate; an interlevel dielectric film provided at least over the MIS transistors and the isolation regions; a plurality of contact holes formed through the interlevel dielectric film, each of the contact holes reaching the doped region or the gate electrode of a corresponding one of the MIS transistors; a plurality of dummy contact holes formed through the interlevel dielectric film to reach the isolation regions; and sidewalls formed on side faces of the contact holes and of the dummy contact holes.

The thickness of the sidewalls formed on side faces of the contact holes varies depending on partial areas of a contour surface constituted by the uppermost face of the interlevel dielectric film and by side and bottom faces of the contact holes and of the dummy contact holes, per unit area of the substrate. According to the present invention, the presence of the dummy contact holes enables an adjustment for making partial areas of the contour surface per unit area of the substrate substantially uniform. As a result, a semiconductor device is obtained with variation in the thickness of the sidewalls suppressed.

When a contour surface constituted by the uppermost face of the interlevel dielectric film and by side and bottom faces of the contact holes and of the dummy contact holes is measured for every partial area per unit area of the substrate, the maximum partial area of the contour surface is preferably 1.6 or less times larger than the minimum partial area of the contour surface.

In this device, the partial areas of the contour surface per unit area of the substrate are substantially uniform. Accordingly, the sidewalls formed on side faces of the first projections have substantially the same thickness between a region where the contact holes are densely arranged and a region where the contact holes are sparsely arranged. As a result, a semiconductor device is obtained with variation in the thickness of the sidewalls suppressed.

An inventive method for fabricating a semiconductor device includes the steps of: a) preparing a substrate; b) forming, on the substrate, a plurality of first projections and a plurality of second projections, each of the first projections including at least a gate electrode; c) implanting impurity ions into the substrate using the first and second projections as a mask, thereby forming doped regions; and d) forming a sidewall film on side faces of the first and second projections, and then forming sidewalls by anisotropic etching. In the step b), the first and second projections are formed such that when the contour surface constituted by the uppermost face of the substrate and by side and upper faces of the first and second projections is measured for every partial area per unit area of the substrate, the maximum partial area of the contour surface is 1.6 or less times larger than the minimum partial area of the contour surface.

In a sacrificial sidewall process, the thickness of sidewalls formed on side faces of first projections varies depending on partial areas of a contour surface per unit area of a substrate. On the other hand, according to the inventive method for fabricating a semiconductor device, when the contour surface is measured for every partial area per unit area of the substrate, the maximum partial area of the contour surface is 1.6 or less times larger than the minimum partial area of the contour surface. That is to say, partial areas of the contour surface per unit area of the substrate are substantially uniform. Accordingly, the sidewalls formed on side faces of the first projections have substantially the same thickness between a region where the first projections are densely arranged and a region where the first projections are sparsely arranged. As a result, a semiconductor device is obtained with variation in the width of the sidewalls suppressed.

Each of the first projections may be a gate including a gate insulating film and a gate electrode formed on the gate insulating film, while each of the second projections may be a dummy gate including a gate insulating film and a gate electrode formed on the gate insulating film.

Alternatively, each of the first projections may be a gate including a gate insulating film and a gate electrode formed on the gate insulating film, while each of the second projections may be an isolation region.

Another inventive method for fabricating a semiconductor device includes the steps of: a) preparing a substrate; b) forming, on the substrate, a plurality of first projections and a plurality of second projections, each of the first projections including at least a gate electrode; c) implanting impurity ions into the substrate using the first and second projections as a mask, thereby forming doped regions; and d) forming a sidewall film on side faces of the first and second projections, and then forming sidewalls by anisotropic etching. In the step b), the first and second projections are formed such that each of the first projection and an adjacent one of the first or second projections are spaced 10 µm or less apart from one another.

With the inventive method for fabricating a semiconductor device, the sidewalls formed on side faces of the first projections have substantially the same thickness. As a result, a semiconductor device is obtained with variation in the width of the sidewalls suppressed.

Another inventive method for fabricating a semiconductor device includes the steps of: a) preparing a substrate; b) forming, on the substrate, a plurality of isolation regions, a plurality of MIS transistors each including a gate insulating film, a gate electrode and a doped region, and an interlevel dielectric film provided over at least the MIS transistors and the isolation regions; c) forming a plurality of contact holes and a plurality of dummy contact holes through the interlevel dielectric film, each of the contact holes reaching the doped region or the gate electrode, each of the dummy contact holes reaching one of the isolation regions; and d) forming a sidewall film on the substrate, and then forming sidewalls on side faces of the contact holes and of the dummy contact holes by anisotropic etching. In the step c), the contact holes and the dummy contact holes are formed such that when a contour surface constituted by the uppermost face of the interlevel dielectric film and by side and bottom faces of the contact holes and of the dummy contact holes is measured for every partial area per unit area of the substrate, the maximum partial area of the contour surface is 1.6 or less times larger than the minimum partial area of the contour surface.

The thickness of the sidewalls formed on side faces of the contact holes varies depending on partial areas of the contour surface constituted by the uppermost face of the interlevel dielectric film and by side and bottom faces of the contact holes and of the dummy contact holes, per unit area of the substrate. According to the inventive method for fabricating a semiconductor device, by providing the dummy contact holes, the maximum partial area of the contour surface is 1.6 or less times larger than the minimum partial area of the contour surface, when the contour surface is measured for every partial area per unit area of the substrate. That is to say, the partial areas of the contour surface can be made uniform. Accordingly, the sidewalls formed on side faces of the contact holes have substantially the same thickness between a region where the contact holes are densely arranged and a region where the contact holes are sparsely arranged. As a result, a semiconductor device is obtained with variation in the thickness of the sidewalls suppressed.

BRIEF DESCRIPTION OF THE DRAWINGS

FIG. 1 is a graph showing the relationship between the surface area of a region of a substrate on which a sidewall insulating film is deposited and the thickness of the sidewall insulating film deposited on side faces of a gate electrode.

FIGS. 5A and 5B are cross-sectional views showing respective process steps for fabricating a semiconductor device according to a second embodiment of the present invention.

FIGS. 6A and 6B are cross-sectional views showing respective process steps for fabricating a semiconductor device using a known sacrificial sidewall process.

FIGS. 7A and 7B are cross-sectional views showing respective process steps for fabricating a semiconductor device according to a third embodiment of the present invention.

FIGS. 9A and 9B are cross-sectional views showing respective process steps for fabricating a semiconductor device according to a fourth embodiment of the present invention.

DESCRIPTION OF THE PREFERRED EMBODIMENTS

Figure 2A:
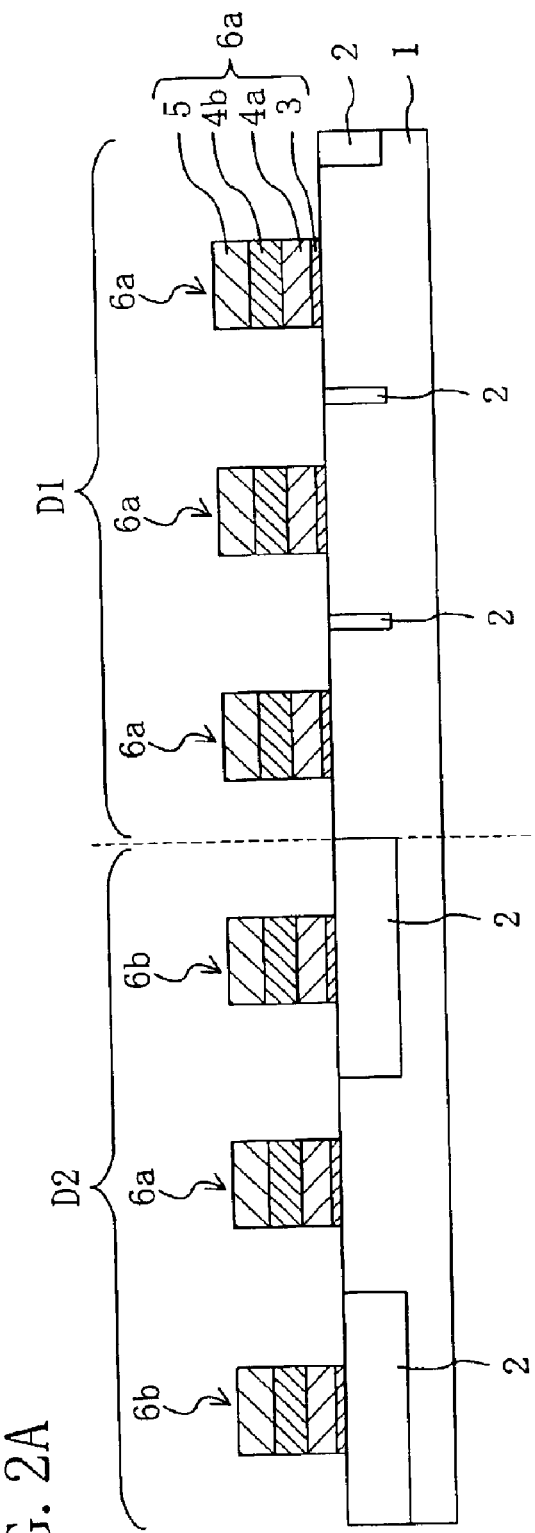
FIGS. 2A and 2B are cross-sectional views showing respective process steps for fabricating a semiconductor device according to a first embodiment of the present invention.

As has been described above, in the known method for fabricating a semiconductor device, if there are the dense region where the gate electrodes are densely arranged and the sparse region where the gate electrodes are sparsely arranged on the semiconductor substrate, the width of the sidewalls varies.

To prevent this variation, the present inventors thought that the width of the sidewalls varies because the deposition rate is determined by the feeding rate of a reactive gas during a CVD process for forming the sidewall insulating film, and they investigated the relationship between the surface area of the substrate on which the sidewall insulating film is deposited and the thickness of the deposited sidewall insulating film. The result is shown in FIG. 1.

FIG. 1 is a graph showing the relationship between the surface area of the region of the substrate on which the sidewall insulating film (a BPSG film) is deposited and the thickness of the sidewall insulating film deposited on side faces of the gate electrodes. The surface area in this case is the area of the upper face (i.e., a contour surface) of the substrate exposed before the sidewall insulating film is formed. The surface area includes upper and side faces of the gate electrodes, upper faces of the isolation regions, and side faces of the steps between the semiconductor substrate and the isolation regions.

The abscissa of FIG. 1 represents the ratio of the surface area of a sparsest region (a region with fewer steps, in which the gate electrodes are arranged most sparsely) in the substrate to the surface area of a densest region (a region with more steps, in which the gate electrodes are arranged most densely), when the upper face of the semiconductor substrate is divided into regions of 10×10 $\mu m^2$. The ordinate represents the ratio of the thickness of the sidewall insulating film in a sparse region to the thickness of the sidewall insulating film in a dense region.

The result shown in FIG. 1 is that when the ratio of the surface area of a dense region per unit area to the surface area of a sparse region per unit area is 1.6 or less, the variation in the thickness of the sidewall insulating film is reduced. Accordingly, if the upper face of the semiconductor substrate is divided into regions of 10×10 $\mu m^2$, the surface areas of these divided regions are compared with each other, and the projecting gate electrodes and the isolation regions, for example, are formed on the semiconductor substrate such that the maximum surface area is 1.6 times as large as the minimum surface area, then the variation in the thickness of the sidewalls can be suppressed. The following first and second embodiments are based on this result.

Hereinafter, preferred embodiments of the present invention will be described with reference to the accompanying drawings, in which each member with substantially the same function will be identified by the same reference numeral for the sake of simplicity of description.

Embodiment 1

FIGS. 2A through 4B are cross-sectional views showing respective process steps for fabricating a semiconductor device according to a first embodiment of the present invention.

First, in a process step shown in FIG. 2A, isolation regions 2 each made of a trench isolation are formed in a semiconductor substrate 1. Then, thermal oxidation is performed in an NO/$O_2$ atmosphere, thereby forming a silicon oxynitride film with a thickness of about 3 nm to be a gate insulating film. Thereafter, an undoped polysilicon film is deposited to a thickness of about 100 nm over the silicon oxynitride film. Subsequently, phosphorus (P) or boron (B) is implanted into part of the polysilicon film. Then, heat treatment is performed at 800° C. for 30 minutes so that phosphorus or boron is uniformly diffused in the polysilicon film, thereby making the polysilicon film p- or n-type. Then, after a natural oxide film formed on the polysilicon film has been removed, a multilayer metal film made of titanium (Ti)/titanium nitride (TiN)/tungsten (W) (having thicknesses of 10 nm (Ti), 20 nm (TiN) and 50 nm (W), respectively) in that order from below is formed by sputtering. Then, a silicon nitride film is deposited by an LP-CVD process to a thickness of about 120 nm over the multilayer metal film. Thereafter, the silicon nitride film, the multilayer metal film, the polysilicon film and the silicon oxynitride film are patterned by photolithography and dry etching, thereby forming a gate insulating film 3 of the silicon oxynitride film, a lower gate electrode 4a of polysilicon, an upper gate electrode 4b of the multilayer metal film, and a gate protective layer 5 of the silicon nitride film, in that order from below. Hereinafter, a stacked structure including: the gate insulating film 3; the lower gate electrode 4a; the upper gate electrode 4b; and the gate protective layer 5 is referred to as a gate electrode 6a.

In this embodiment, in the process step shown in FIG. 2A, the upper face of the semiconductor substrate 1 is divided into regions of 10×10 $\mu m^2$, and the dummy gate electrodes 6b having completely the same structure as that of the gate electrodes 6a are formed in a sparse region D2 where the gate electrodes 6a are arranged most sparsely, concurrently with the formation of the gate electrodes 6a, such that the ratio of the surface area of a dense region D1 where the gate electrodes 6a are arranged most densely to the surface area of the sparse region D2 is 1.6 or less.

Figure 2B:
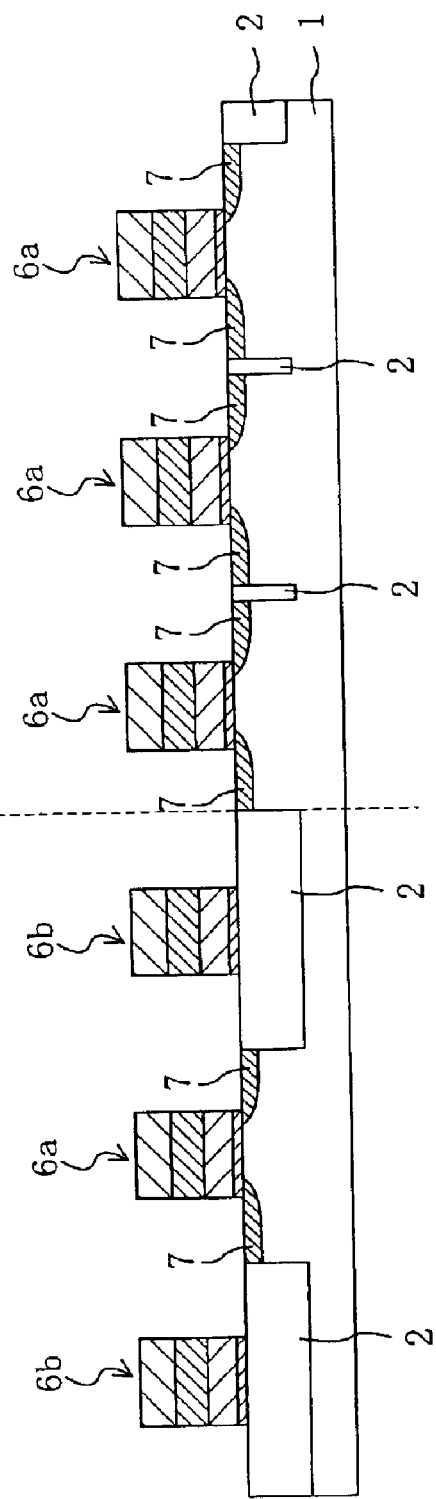

Next, in a process step shown in FIG. 2B, impurity ions are implanted into the semiconductor substrate 1 using the gate electrodes 6a and the isolation regions 2 as a mask, thereby defining first doped regions 7 to be LDD regions or extension doped regions.

Figure 3A:
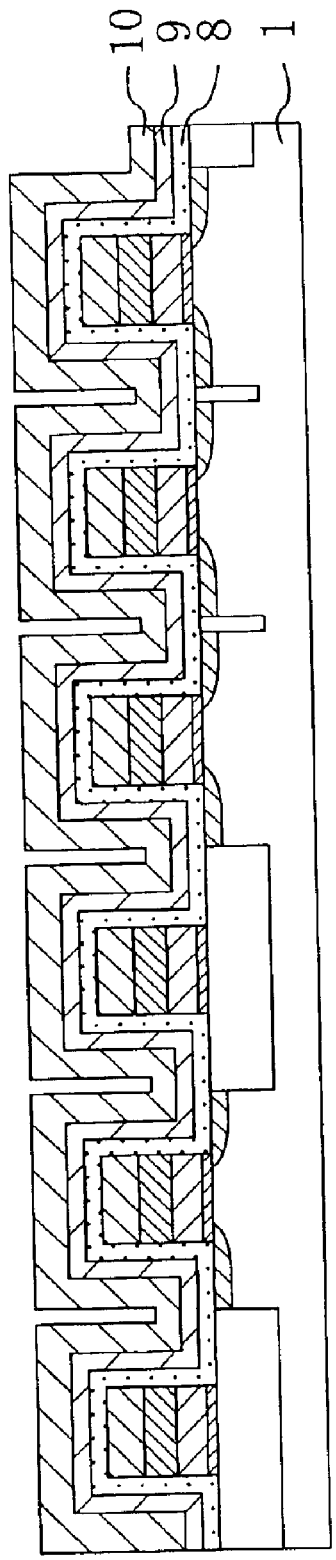
FIGS. 3A and 3B are cross-sectional views showing respective process steps for fabricating the semiconductor device of the first embodiment.

Next, in a process step shown in FIG. 3A, an underlying insulating film 8 of an NSG film (a silicon oxide film containing no impurities) with a thickness of about 20 nm, a protective insulating film 9 of a silicon nitride film with a thickness of about 20 nm, and a sidewall insulating film 10 of a BPSG film with a thickness of about 100 nm are formed by a CVD process in this order over the substrate.

Figure 3B:
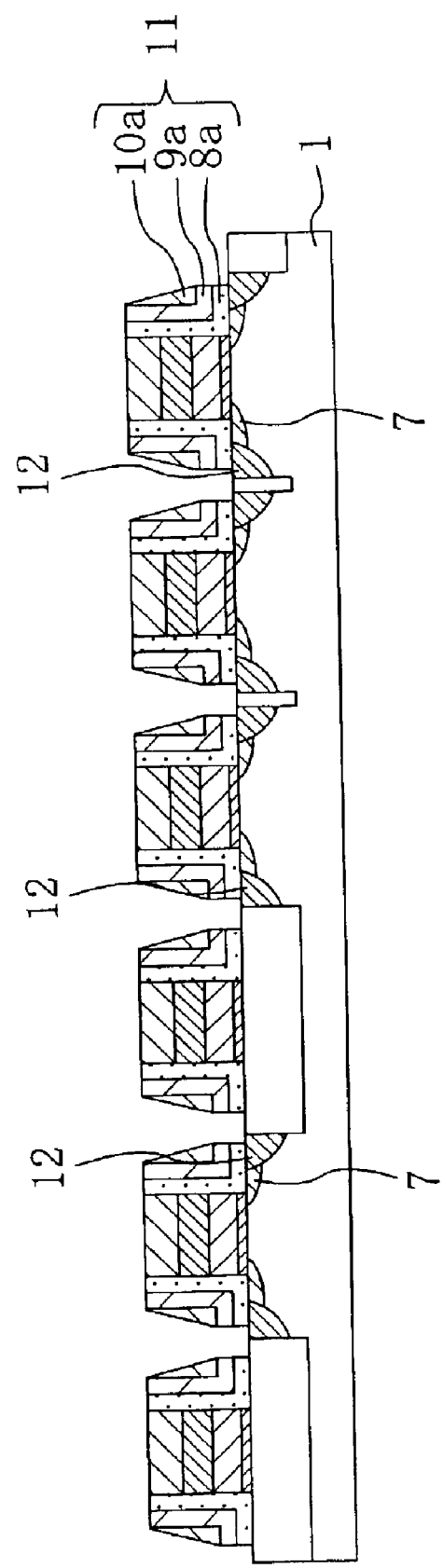

Then, in a process step shown in FIG. 3B, the sidewall insulating film 10, the protective insulating film 9 and the underlying insulating film 8 are etched in this order by anisotropic dry etching, thereby forming sidewalls 11 each having a multilayer structure including an underlying insulating film 8a, a protective insulating film 9a and a sidewall insulating film 10a. Subsequently, impurity ions are implanted into the semiconductor substrate 1 using the gate electrodes 6a, the sidewalls 11 and the isolation regions 2 as a mask, thereby defining second doped regions 12 to be heavily-doped source/drain regions.

Figure 4A:
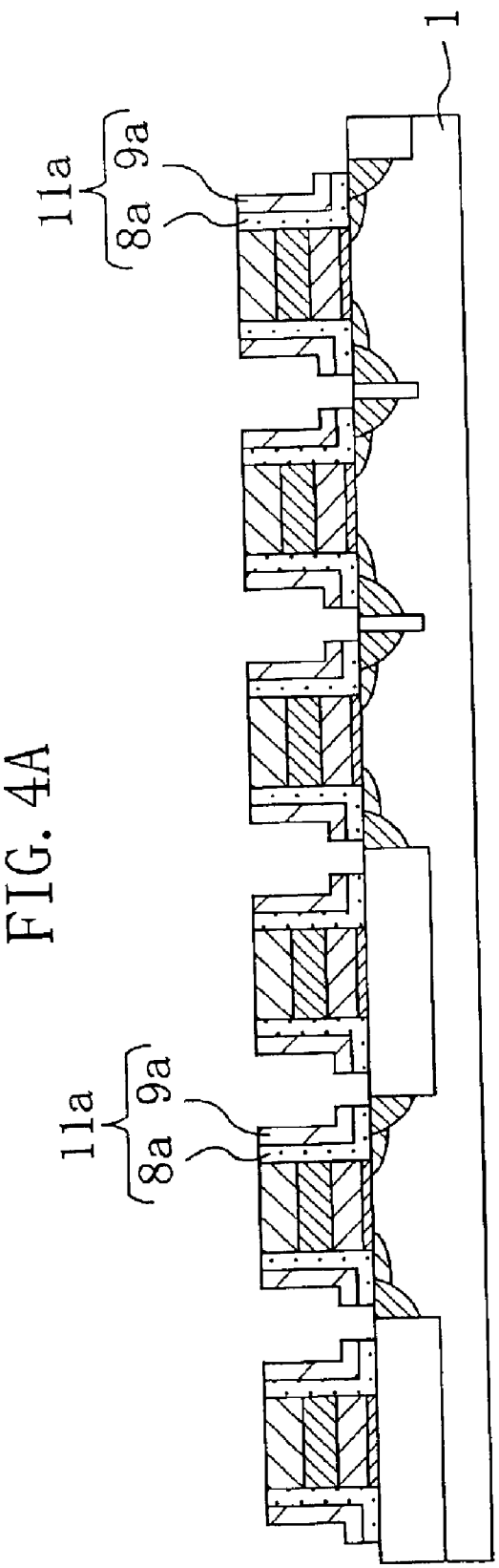
FIGS. 4A and 4B are cross-sectional views showing respective process steps for fabricating the semiconductor device of the first embodiment.

Thereafter, in a process step shown in FIG. 4A, the sidewall insulating film 10a made of a BPSG film and included in the sidewalls 11 is selectively removed by wet etching, thereby forming L-shaped sidewalls 11a including the underlying insulating film 8a and the protective insulating film 9a.

Subsequently, in a process step shown in FIG. 4B, an interlevel dielectric film 13 of a BPSG film is deposited by a CVD process over the substrate, and then the surface of the interlevel dielectric film 13 is planarized by a CMP process. At this time, since the sidewall insulating film 10a used as a mask for forming the second doped regions 12 has been removed, the gate electrode 6a-to-gate electrodes 6a spacing and the gate electrode 6a-to-dummy gate electrode 6b increase. Therefore, the interlevel dielectric film 13 fills the gate electrode 6a-to-gate electrodes 6a spacing and the gate electrode 6a-to-dummy gate electrode 6b completely without creating any void.

In the method for fabricating the semiconductor device according to this embodiment, in the process step shown in FIG. 2A, the upper face of the semiconductor substrate 1 is divided into regions of 10×10 $\mu m^2$, and the dummy gate electrodes 6b are formed in the sparse region D2 where the density of the gate electrodes 6a is at the minimum such that the ratio of the surface area of the dense region D1 where the density of the gate electrodes 6a is at the maximum to the surface area of the sparse region D2 is 1.6 or less.

In this manner, in depositing the underlying insulating film 8, the protective insulating film 9 and the sidewall insulating film 10 by CVD processes, it is possible to obtain the sidewall insulating film 10 formed on side faces of the gate electrodes 6a and having the same thickness between the dense region D1 and the sparse region D2. Accordingly, the sidewalls 11, which are formed by anisotropic dry etching, can be formed to have substantially the same width between the dense region D1 and the sparse region D2. That is to say, the variation in the width of the sidewalls 11 can be suppressed.

In this embodiment, the upper surface of the semiconductor substrate 1 is divided into regions of 10×10 $\mu m^2$. However, the present invention is not limited to this specific embodiment. The variation in the width of the sidewalls 11 can be suppressed by forming the dummy gate electrodes 6b in the sparse region D2 such that the surface area ratio of the dense region D1 to the sparse region D2 is 1.6 or less, so long as the upper surface of the semiconductor substrate 1 is divided into regions of 10×10 $\mu m^2$ through 20×20 $\mu m^2$.

Embodiment 2

FIGS. 5A and 5B are cross-sectional views showing respective process steps for fabricating a semiconductor device according to a second embodiment of the present invention.

First, in a process step shown in FIG. 5A, isolation regions 2 each made of a trench isolation and a projecting isolation portion 15 are formed in a semiconductor substrate 1. Then, gate electrodes 6a each including: a gate insulating film 3 of a silicon oxynitride film; a lower gate electrode 4a of polysilicon; an upper gate electrode 4b of a multilayer metal film; and a gate protective layer 5 of a silicon nitride film, in that order from below, is formed.

In this embodiment, in the process step shown in FIG. 5A, the upper face of the semiconductor substrate 1 is divided into regions of 10×10 $\mu m^2$, and the projecting isolation portion 15 whose height from the surface of the semiconductor substrate 1 is larger than that of the isolation regions 2 is formed in a sparse region D2 where the gate electrodes 6a are arranged most sparsely such that the ratio of the surface area of a dense region D1 where the gate electrodes 6a are arranged most densely to the surface area of the sparse region D2 is 1.6 or less.

Next, in a process step shown in FIG. 5B, as in the process steps shown in FIGS. 2B, 3A and 3B, after the first doped regions 7 to be LDD regions or extension doped regions have been formed, an underlying insulating film (now shown), a protective insulating film (now shown), and a sidewall insulating film (now shown) are formed by CVD processes in this order over the substrate. Subsequently, the sidewall insulating film, the protective insulating film and the underlying insulating film are etched in this order by anisotropic etching, thereby forming sidewalls 11 each including an underlying insulating film 8a, a protective insulating film 9a and a sidewall insulating film 10a. Thereafter, impurity ions are implanted into the semiconductor substrate 1 using the gate electrodes 6a, the sidewalls 11, the isolation regions 2 and the projecting isolation portion 15 as a mask, thereby defining second doped regions 12 to be heavily-doped source/drain regions.

Then, as in the process step shown in FIG. 4A in the first embodiment, the sidewall insulating film 10a included in the sidewalls 11 is selectively removed by wet etching, thereby forming L-shaped sidewalls including the underlying insulating film 8a and the protective insulating film 9a.

Figure 4B:
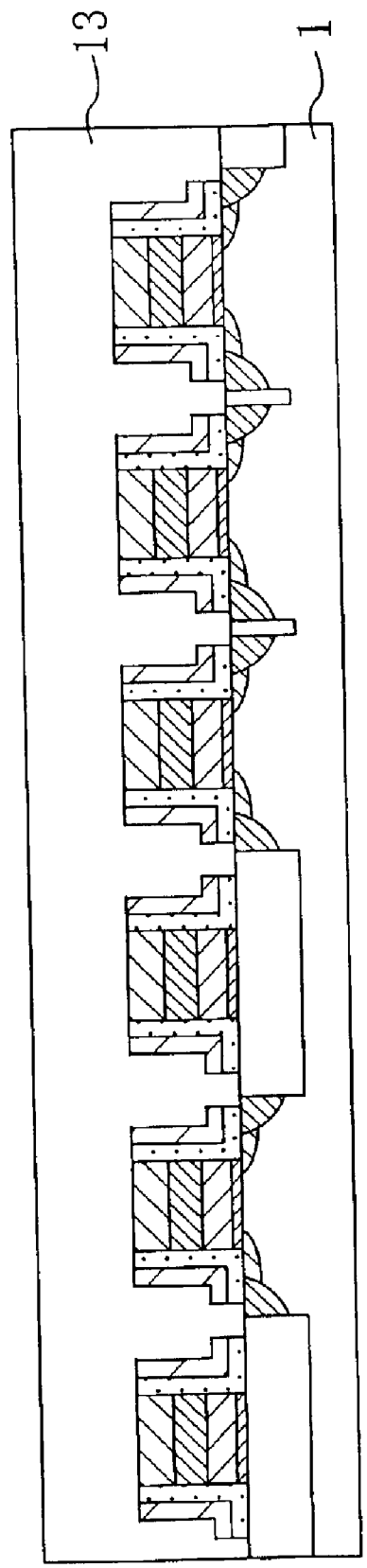

Thereafter, as in the process step shown in FIG. 4B in the first embodiment, an interlevel dielectric film of a BPSG film is deposited by a CVD process over the substrate, and then the surface of the interlevel dielectric film is planarized by a CMP process.

In this embodiment, in the process step shown in FIG. 5A, the upper face of the semiconductor substrate 1 is divided into regions of 10×10 $\mu m^2$, and the projecting isolation portion 15 whose height from the surface of the semiconductor substrate 1 is larger than that of the isolation regions 2 is formed in the sparse region D2 where the density of the gate electrodes 6a is at the minimum such that the ratio of the surface area of the dense region D1 where the density of the gate electrodes 6a is at the maximum to the surface area of the sparse region D2 is 1.6 or less.

Therefore, the sidewalls 11, which are formed by anisotropic dry etching, can be made of the sidewall insulating film 10a having substantially the same thickness between the dense region D1 and the sparse region D2. That is to say, the variation in the width of the sidewalls 11 can be suppressed.

Embodiment 3

FIGS. 6A and 6B are views showing respective process steps for fabricating a semiconductor device using a known sacrificial sidewall process.

In the known sacrificial sidewall process, as shown in FIG. 6A, there are cases where a dense region D1 in which the gate electrodes 6a are arranged most densely and a sparse region D2 in which none of the gate electrodes 6a is arranged on the semiconductor substrate. In such cases, the sidewalls 11 formed on side faces of the gate electrodes 6a located at the edge of the dense region D1 (i.e., the gate electrodes 6a adjacent to the sparse region D2) tend to be wider as shown in FIG. 6B. This is because, if a region D2' extending across the boundary between the dense region D1 and the sparse region D2 on the semiconductor substrate 1 is provided as shown in FIGS. 6A and 6B, the surface area of the region D2' is extremely smaller than that of the dense region D1.

In view of this, in this embodiment, the dummy electrodes 6b are provided in the sparse region D2 so that the variation in the width of the sidewalls 11 is reduced. Specifically, description will be made hereinafter with reference to FIGS. 7A and 7B. FIGS. 7A and 7B are cross-sectional views showing respective process steps for fabricating a semiconductor device according to a third embodiment of the present invention.

First, in a process step shown in FIG. 7A, isolation regions (not shown) each made of a trench isolation are formed in a semiconductor substrate 1. Then, as in the first embodiment, gate electrodes 6a each including: a gate insulating film 3 of a silicon oxynitride film; a lower gate electrode 4a of polysilicon; an upper gate electrode 4b of a multilayer metal film; and a gate protective layer 5 of a silicon nitride film, in that order from below, is formed. In this case, concurrently with the formation of the gate electrodes 6a, dummy gate electrodes 6b having completely the same structure as that of the gate electrodes 6a are formed in a region D3 extending a distance (10 $\mu$m in this embodiment) from the end of a dense region D1 where the gate electrodes 6a are densely arranged.

Next, as in the process steps shown in FIGS. 2B and 3A in the first embodiment, first doped regions (not shown) to be LDD regions or extension doped regions are formed, and then an underlying insulating film (not shown), a protective insulating film (not shown) and a sidewall insulating film (not shown) are deposited in this order by CVD processes over the substrate.

Then, in a process step shown in FIG. 7B, the sidewall insulating film, the protective insulating film and the underlying insulating film are etched in this order by anisotropic etching, thereby forming the sidewalls 11 each having a multilayer structure including an underlying insulating film 8a, a protective insulating film 9a and a sidewall insulating film 10a. Subsequently, impurity ions are implanted into the substrate using the gate electrodes 6a, the sidewalls 11, as a mask, thereby defining second doped regions (not shown) to be heavily doped source/drain regions.

Thereafter, as in the process step shown in FIG. 4A in the first embodiment, the sidewall insulating film 10a included in the sidewalls 11 is selectively removed by wet etching, thereby forming L-shaped sidewalls including the underlying insulating film 8a and the protective insulating film 9a.

Subsequently, as in the process step shown in FIG. 4B, an interlevel dielectric film of a BPSG film is deposited by a CVD process over the substrate and then the surface of the interlevel dielectric film is planarized by a CMP process.

Figure 8:
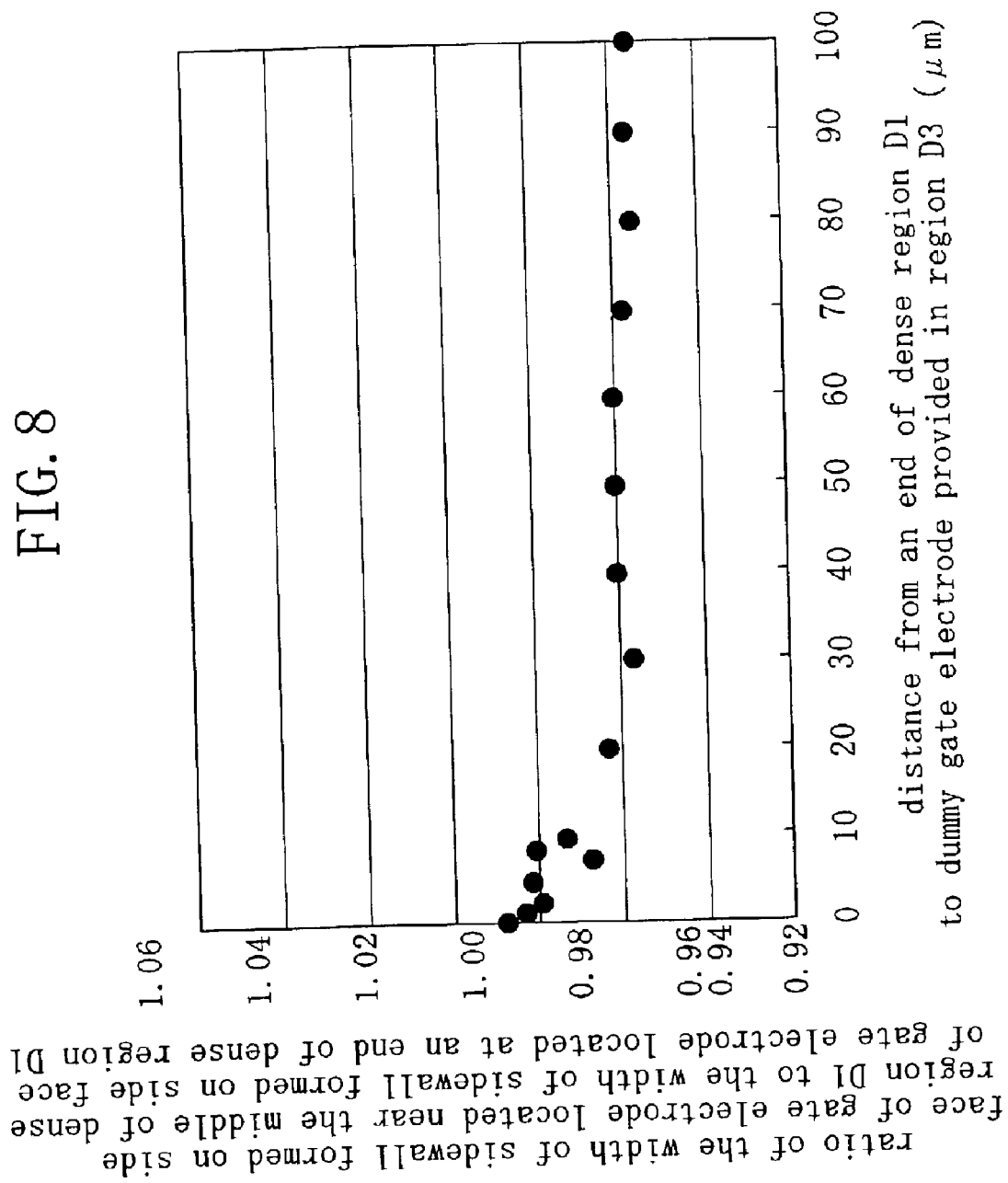
FIG. 8 is a graph showing the relationship between the distance from an end of a dense region D1 where gate electrodes are arranged most densely to one of dummy gate electrodes in a region D3 and the ratio of the thickness of a sidewall formed on a side face of one of the gate electrodes located near the middle of the dense region D1 to the thickness of a sidewall formed on a side face of one of the gate electrodes located at the edge of the dense region D1.
Figures 10A, 10B:
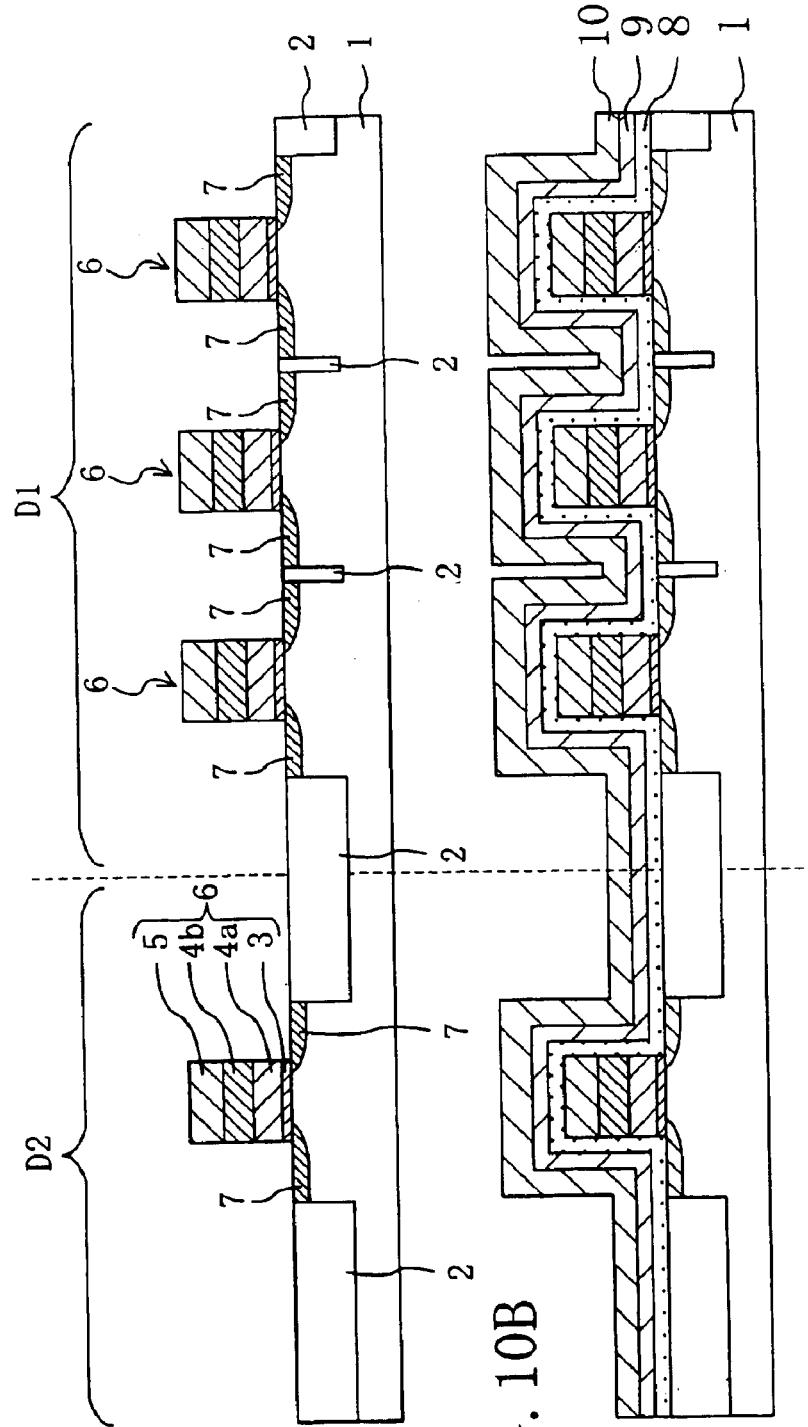
FIGS. 10A and 10B are cross-sectional views showing respective process steps for fabricating a semiconductor device using the known sacrificial sidewall process.
Figures 11A, 11B:
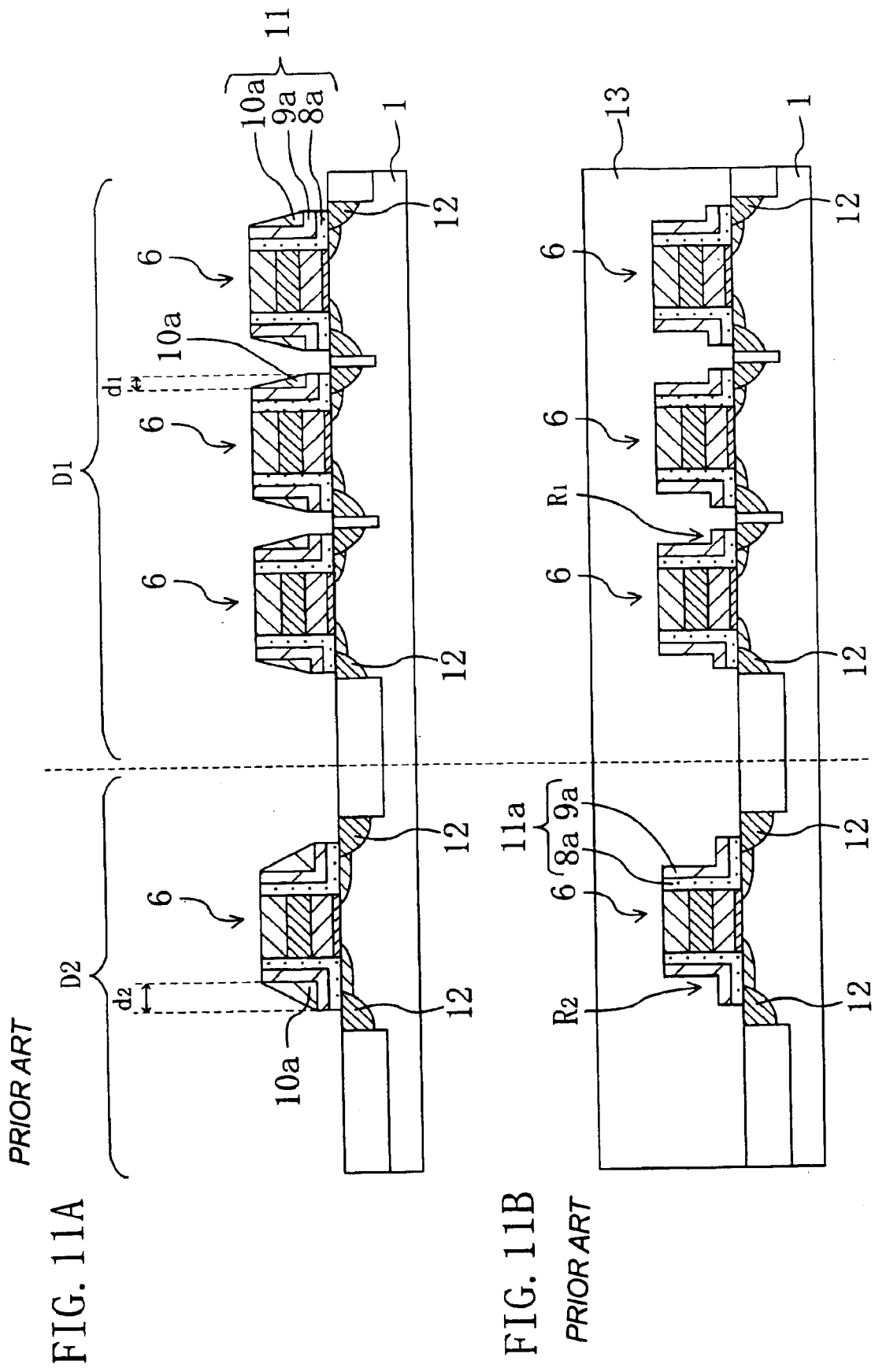
FIGS. 11A and 11B are cross-sectional views showing respective process steps for fabricating a semiconductor device using the known sacrificial sidewall process.

FIG. 8 is a graph showing the relationship between the distance from an end of the dense region D1 where the gate electrodes 6a are arranged most densely to one of the dummy gate electrodes 6b in the region D3 and the ratio of the width of one of the sidewalls 11 formed on a side face of one of the gate electrodes 6a located near the middle of the dense region D1 to the width of one of the sidewalls 11 formed on a side face of one of the gate electrodes 6a located at the edge of the dense region D1.

The result shown in FIG. 8 is that if the dummy gate electrodes 6b are provided within 10 μm of the edge of dense region D1, the variation in the width of the sidewalls 11 is reduced. Accordingly, in the process step shown in FIG. 7A, the gate electrodes 6a and the dummy gate electrodes 6b are preferably formed such that each of the gate electrodes 6a and an adjacent one of the gate electrodes 6a or dummy gate electrodes 6b are spaced 10 μm or less apart from one another. Then, the variation in the thickness of the sidewall insulating film 10a can be reduced.

Embodiment 4

In a known method for fabricating a semiconductor device, there are cases where when a contact hole connecting a doped region or a gate electrode to an upper wire is formed, a sidewall is formed in the contact hole so as to enlarge an alignment margin for the contact hole. However, if there are a dense region where contact holes are densely arranged and a sparse region where contact holes are sparsely arranged, the thickness of sidewalls varies. As a result, the alignment margins for the contact holes are reduced, and short-circuits might occur when plugs filling the contact holes are formed.

Therefore, the thickness of the deposited film can vary in every case where a film is deposited by a CVD process on a region having an uneven surface. The relationship between the surface area of a region on which the film is deposited and the thickness of the deposited film is substantially the same as that shown in FIG. 1.

On the other hand, in the methods for fabricating the semiconductor devices according to the first and second embodiments, projecting members (i.e., the gate electrodes, dummy gate electrodes and projecting isolation portion) are formed on the semiconductor substrate so as to control the surface area of the region on which the sidewall insulating film is deposited. This prevents the variation in the thickness of the sidewalls formed on side faces of the gate electrodes.

That is to say, the method of controlling the surface area by forming the uneven surface for the purpose of preventing the variation in the thickness of the deposited film is effective in every case where a film is to be deposited by a CVD process on a region with the uneven surface.

In view of this, in this embodiment, a dummy contact hole is provided so as to suppress the variation in the thickness of the sidewalls. A method for fabricating a semiconductor device according to this embodiment will be hereinafter described with reference to FIGS. 9A and 9B. FIGS. 9A and 9B are cross-sectional views showing respective process steps for fabricating a semiconductor device of this embodiment.

First, in a process step shown in FIG. 9A, as in the first embodiment, a semiconductor substrate 1 is provided with: isolation regions 2 each made of a trench isolation; gate electrodes 6a each including a gate insulating film 3, a lower gate electrode 4a, an upper gate electrode 4b and a gate protective layer 5; first doped regions (not shown) to be LDD regions or extension doped regions; second doped regions (not shown) to be heavily doped source/drain regions; L-shaped sidewalls 11a each made of an underlying insulating film 8a and a protective insulating film 9a; and an interlevel dielectric film 13.

Next, contact holes 16a are formed through the interlevel dielectric film 13 by photolithography and dry etching to reach the second doped regions and the upper gate electrodes 4b. Concurrently with the formation of the contact holes 16a, a dummy contact hole 16b is formed through the interlevel dielectric film 13 to reach one of the isolation regions 2.

In this embodiment, the upper face of the interlevel dielectric film 13 is divided into regions of 10×10 μm$^2$, and the dummy contact hole 16b is formed in a sparse region E2 where the contact holes 16a are arranged most sparsely such that the ratio of the surface area of a dense region E1 where the contact holes 16a are arranged most densely to the surface area of the sparse region E2 is 1.6 or less. In this case, the surface area is the area of the upper face (i.e., a contour surface) of the substrate exposed before the sidewall insulating film is formed. The surface area includes side and bottom faces of the contact holes.

Then, in a process step shown in FIG. 9B, a sidewall insulating film is formed by a CVD process over the entire surface of the substrate, and then is etched by anisotropic dry etching, thereby forming sidewalls 17 on side faces of the contact holes 16a and the dummy contact hole 16b.

In the method for fabricating a semiconductor device according to this embodiment, the upper face of the interlevel dielectric film 13 is divided into regions of 10×10 μm$^2$, and the dummy contact hole 16b is formed in the sparse region E2 where the contact holes 16a are arranged most sparsely such that the ratio of the surface area of the dense region E1 where the contact holes 16a are arranged most densely to the surface area of the sparse region E2 is 1.6 or less.

Accordingly, the sidewalls 17, which are formed by anisotropic dry etching, can be formed to have substantially the same thickness between the dense region E1 and the sparse region E2. That is to say, the variation in the thickness of the sidewalls 17 can be suppressed.

In addition, since the variation in the thickness of the sidewalls 17 is suppressed, alignment margins can be enlarged in forming contact holes. Therefore, when plugs connecting doped regions to upper wires are formed, it is possible to prevent short-circuits from occurring.

As a result, according to the present invention, a highly reliable semiconductor device can be provided.

What is claimed is:

1. A semiconductor device, comprising:

a substrate;

a plurality of MIS transistors, each of the MIS transistors being formed on the substrate and including a gate insulating film, a gate electrode and a doped region;

a plurality of isolation regions formed in the substrate;

an interlevel dielectric film provided at least over the MIS transistors and the isolation regions;

a plurality of contact holes formed through the interlevel dielectric film, each of the contact holes reaching the doped region or the gate electrode of a corresponding one of the MIS transistors;

a plurality of dummy contact holes formed through the interlevel dielectric film to reach the isolation regions; and sidewalls formed on side faces of the contact holes and of the dummy contact holes.

2. The semiconductor device of claim 1, wherein when a contour surface constituted by the uppermost face of the interlevel dielectric film and by side and bottom faces of the contact holes and of the dummy contact holes is measured for every partial area per unit area of the substrate, the maximum partial area of the contour surface is 1.6 or less times larger than the minimum partial area of the contour surface.

3. A semiconductor device, comprising:
a sparse region in which a plurality of first gates are arranged; and
a dense region in which a plurality of second gates are arranged more densely than the plurality of first gates in the sparse region,
wherein the sparse region includes:
a first isolation region formed in a semiconductor substrate;
the plurality of first gates formed on the semiconductor substrate and including a gate insulating film and a gate electrode formed on the gate insulating film; and
a dummy gate formed on the first isolation region and having the same structure as one of the plurality of first gates,
wherein the dense region includes:
a second isolation region formed in the semiconductor substrate;
the plurality of second gates formed on the semiconductor substrate, one of the plurality of second gates having a same structure as one of the plurality of first gates,
wherein L-shaped sidewalls are formed on each side face of the plurality of first gates, each side face of the plurality of second gates and each side face of the dummy gate, and
wherein the second isolation region has a width narrower than the first isolation region, and no dummy gate is formed on the second isolation region.

4. The semiconductor device of claim 3, wherein the L-shaped sidewalls include an underlying insulating film and a protective insulating film.

5. The semiconductor device of claim 3, wherein the dummy gate is formed in the sparse region, such that the ratio of the surface area of the dense region per unit area to the surface area of the sparse region per unit area is 1.6 times or less.

6. The semiconductor device of claim 5, wherein the unit area is in a range of 10×10 $\mu$m$^2$ through 20×20 $\mu$m$^2$.

7. A semiconductor device, comprising:
a sparse region in which a plurality of first gates are arranged; and
a dense region in which a plurality of second gates are arranged more densely than the plurality of first gates in the sparse region,
wherein the sparse region includes:
a first isolation region formed in a semiconductor substrate; and
the plurality of first gates formed on the semiconductor substrate and including a gate insulating film and a gate electrode formed on the gate insulating film,
wherein the dense region includes:
a second isolation region formed in the semiconductor substrate;
the plurality of second gates formed on the semiconductor substrate, one of the plurality of second gates having a same structure as one of the plurality of first gates, and
wherein the first isolation region is formed such that the height of the first isolation region from a surface of the semiconductor substrate is larger than that of the second isolation region from a surface of the semiconductor substrate.

8. The semiconductor device of claim 7, wherein L-shaped sidewalls are formed on each side face of the plurality of first gates and each side face of the plurality of second gates.

9. The semiconductor device of claim 8, wherein the L-shaped sidewalls include an underlying insulating film and a protective insulating film.

10. The semiconductor device of claim 7, wherein a dummy gate is formed in the sparse region, such that the ratio of the surface area of the dense region per unit area to the surface area of the sparse region per unit area is 1.6 times or less.

11. The semiconductor device of claim 10, wherein the unit area is in a range of 10×10 $\mu$m$^2$ through 20×20 $\mu$m$^2$.

12. The semiconductor device of claim 7, wherein the second isolation region has a width narrower than the first isolation region.

* * * * *